(12) United States Patent
Li et al.

(10) Patent No.: US 12,266,605 B2
(45) Date of Patent: Apr. 1, 2025

(54) TOP VIA INTERCONNECTS WITH LINE WIGGLING PREVENTION

(71) Applicant: International Business Machines Corporation, Armonk, NY (US)

(72) Inventors: Tao Li, Slingerlands, NY (US); Ruilong Xie, Niskayuna, NY (US); Tsung-Sheng Kang, Ballston Lake, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 17/487,693

(22) Filed: Sep. 28, 2021

(65) Prior Publication Data

US 2023/0102662 A1 Mar. 30, 2023

(51) Int. Cl.
*H01L 23/528* (2006.01)
*H01L 21/768* (2006.01)
*H01L 23/532* (2006.01)

(52) U.S. Cl.
CPC .... *H01L 23/5283* (2013.01); *H01L 21/76834* (2013.01); *H01L 21/76877* (2013.01); *H01L 23/53266* (2013.01)

(58) Field of Classification Search
CPC .......... H01L 23/5283; H01L 21/76834; H01L 21/76877; H01L 23/53266
See application file for complete search history.

(56) References Cited

U.S. PATENT DOCUMENTS

| | | | |
|---|---|---|---|
| 8,114,769 B1 | 2/2012 | Srivastava | |
| 8,357,609 B2 | 1/2013 | Ryan | |
| 8,519,540 B2 | 8/2013 | Chen | |
| 9,530,733 B2 | 12/2016 | Bristol | |
| 9,646,883 B2 | 5/2017 | Brink | |
| 9,953,916 B2 | 4/2018 | Chen | |
| 10,020,254 B1 * | 7/2018 | Bao | H01L 23/53228 |
| 10,177,031 B2 | 1/2019 | Bao | |
| 10,395,986 B1 | 8/2019 | Briggs | |
| 11,848,264 B2 * | 12/2023 | Motoyama | H01L 23/53266 |
| 2012/0098133 A1 | 4/2012 | Yang | |
| 2012/0187566 A1 | 7/2012 | Horak | |
| 2013/0193579 A1 | 8/2013 | Ponoth | |
| 2014/0091360 A1 | 4/2014 | Pillarisetty | |
| 2015/0235957 A1 * | 8/2015 | Zhang | H01L 21/76849 257/751 |
| 2018/0166334 A1 * | 6/2018 | Kim | H01L 21/76846 |
| 2018/0269306 A1 | 9/2018 | Bao | |
| 2019/0206733 A1 | 7/2019 | Lin | |
| 2020/0144273 A1 * | 5/2020 | Huang | H10B 12/0335 |
| 2020/0312705 A1 * | 10/2020 | Dai | H01L 21/76849 |

* cited by examiner

*Primary Examiner* — Yara B Green
*Assistant Examiner* — Fakeha Sehar
(74) *Attorney, Agent, or Firm* — Edward J. Wixted, III

(57) ABSTRACT

Embodiments of the invention include a method for fabricating a semiconductor device and the resulting structure. A metal line is formed on a bottom liner, a sacrificial hardmask on a top surface of the metal line. Portions of the sacrificial hardmask are selectively removed that that do not correspond a desired location of a top via. The remaining sacrificial hardmask is replaced with the top via, the top via and the metal line each tapered such that a width at each respective bottom surface is greater than a width of each respective top surface.

20 Claims, 11 Drawing Sheets

TOP VIA INTERCONNECTS WITH LINE WIGGLING PREVENTION

BACKGROUND

The present invention relates generally to the field of semiconductor structures and fabrication, and more particularly to the fabrication of a top via and interconnect line structure with line wiggling protection.

Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections.

A via is an electrical connection between layers in a physical electronic circuit that goes through the plane of one or more adjacent layers. In integrated circuit design, a via is a small opening in an insulating oxide layer that allows a conductive connection between different layers.

SUMMARY

Embodiments of the invention include a method for fabricating a semiconductor device and the resulting structure. The method can include forming a metal line on a bottom liner, a sacrificial hardmask on a top surface of the metal line. The method can also include selectively removing portions of the sacrificial hardmask that do not correspond a desired location of a top via. The method can also include replacing the remaining sacrificial hardmask with the top via, the top via and the metal line each tapered such that a width at each respective bottom surface is greater than a width of each respective top surface.

DETAILED DESCRIPTION

Figure 1:
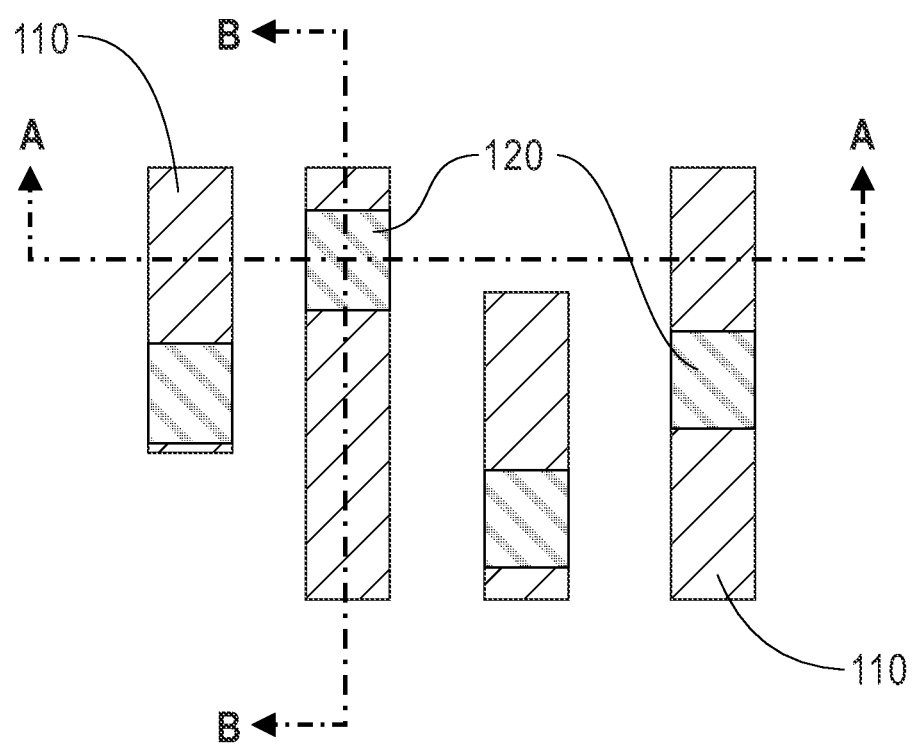
FIG. 1 depicts a top-down view of a simplified structure of an interconnect device comprising a plurality of top vias and metal lines that defines the orientation and identifies planes in which other Figures base their orientation, in accordance with an embodiment of the present invention.

Embodiments of the present invention recognize that convention approaches to forming via/metal line interconnect structures by subtractive metal patterning begin with forming tall metal lines by metal etch processes, followed by top via patterning by recessing the metal lines where no via is present. Embodiments of the present invention describe a process that ensure liner-less via formation over metal lines with no other metal liner between the metal line and top via interface. Embodiments of the present invention recognize that when metal pitch and metal critical dimension (CD) scales down, forming such tall metal lines with high aspect ration can result in a high risk of line wiggling issues.

Embodiments of the present invention disclose a fabrication method and structure to reduce line wiggling by forming metal lines with a sacrificial hardmask, forming a sacrificial via in the sacrificial hardmask and removing portions of the sacrificial hardmask and sacrificial via layers in regions where no via is desired, and removing the sacrificial hardmask and replacing it with via metal material. Embodiments of the present invention describe a structure that results in (i) top vias over metal lines, where no sidewall metal liner is present for both the metal lines and vias, (ii) top vias and top metal lines with a positive tapered angle, such that a width of the metal lines and top vias narrows towards the top of each structure, and (iii) liners that are present on both top and bottom surfaces of the metal lines, except for locations where top vias are located on top of the metal lines.

Embodiments of the present invention recognize that such an approach and structure utilizes lower initial Ru thickness which allows for low hardmask height and a lower aspect ratio, which helps with a better profile (due to the lower aspect ratio) and less hardmask loading (due to the reduced Ru thickness). The lower aspect ratio helps reduce potential line wiggling issues during fabrication of the structure. Further, such a fabrication process results in a better top via profile as the top via is not created by Ru recess, and is rather created by self-aligned top via formation.

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Turning now to an overview of technologies that are more specifically relevant to aspects of the present invention, ICs are fabricated in a series of stages, including a front-end-of-line (FEOL) stage, a middle-of-line (MOL) stage, and a BEOL stage. The process flows for fabricating modern ICs are often identified based on whether the process flows fall in the FEOL stage, the MOL stage, or the BEOL stage. Generally, the FEOL stage is where device elements (e.g., transistors, capacitors, resistors) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As used herein, a "top via" refers to the "V," layer via which electrically couples a line below (an "$M_x$" layer) and may also electrically couple to a line above (an "$M_{x+1}$" layer). Embodiments of the present invention form an alternate metal top via (e.g., Co, Ru) on the metal line below. There is no barrier metal between the via and the line metal below. Both the metal line and via have a positive tapered angle such that the width narrows in an upward direction towards the top of the component (e.g., the width top of the via is more narrow than the width at the bottom of the via).

The present invention will now be described in detail with reference to the Figures.

Figure 2A:
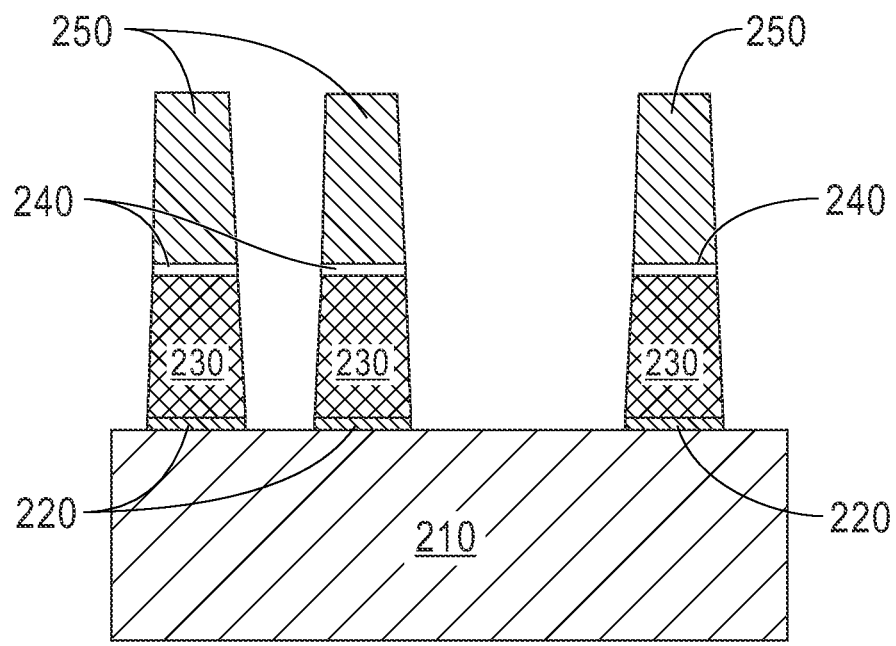
FIG. 2A depicts a cross-sectional view, along section line A of FIG. 1.
Figure 2B:
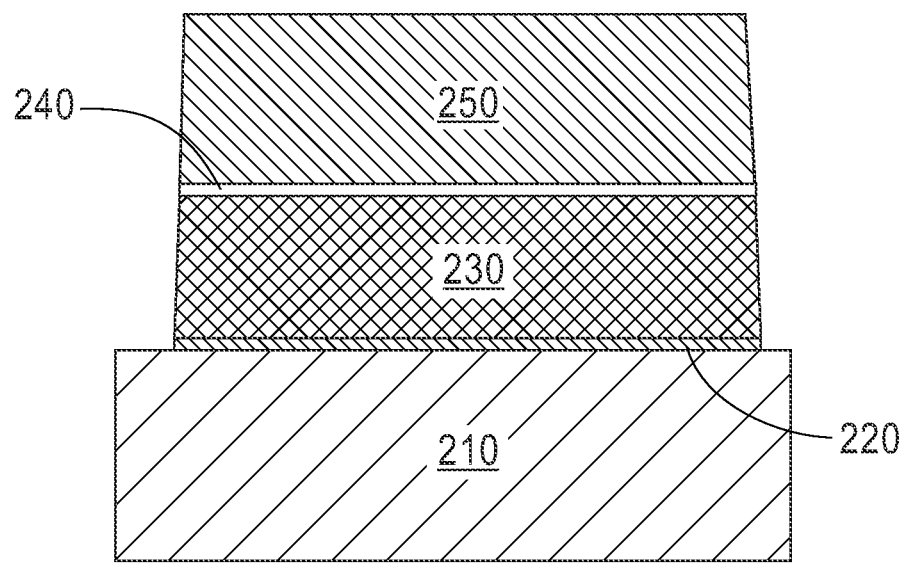
FIG. 2B depicts a cross-sectional view, along section line B of FIG. 1, of a semiconductor structure after an initial set of processing operations, in accordance with an embodiment of the invention.

FIG. 1 depicts a top-down view of a simplified interconnect structure. As depicted, the semiconductor structure of FIG. 1 shows a simplified layout of metal lines 110 and vias 120. FIG. 1 also includes section line A and section line B. Section line A and section line B each correspond to cross-sectional views that are used in subsequent Figures to describe the fabrication process and resulting structure in accordance with embodiments of the present invention. For example, FIG. 2A is a cross-sectional view along section line A of FIG. 1 and FIG. 2B is a cross-sectional view along section line B of FIG. 1. It should be noted that the simplified depiction of FIG. 1, along with the presence of section line A and section line B, as provided for purposes of establishing orientation of the views with regard to the overall structure and that the other Figures describe herein do not necessarily correspond to the actual structure that is depicted in FIG. 1. In general, FIG. 1 is meant to show the location of vias and metal lines to aid in interpreting the remaining Figures. However, it should be noted that other layouts of vias (e.g., vias 120) and metal lines (e.g., metal lines 110) are anticipated and the particular layout of vias 120 and metal lines 110 in FIG. 1 is merely one example embodiment.

FIG. 2A depicts a cross-sectional view along section line A of FIG. 1 and FIG. 2B depicts a cross-sectional view along section line B of FIG. 1, of fabrication steps, in accordance with an embodiment of the present invention. FIGS. 2A and 2B depict a starting structure for the device that includes underneath device 210, liner 220, metal lines 230, etch stop liner 240, and hardmask 250.

Underneath device 210 may comprise either FEOL devices (e.g., transistors, capacitors, resisters), MOL, or additional BEOL metallization layers. The particular composition of underneath device 210 may vary based on the type of device desired.

Liner 220 is formed on underneath device 210 by sputtering, chemical vapor deposition (CVD), or atomic layer deposition (ALD) and is a conductor such as titanium nitride (TiN), titanium aluminum carbine (TiAlC), titanium carbine (TiC), or tantalum nitride (TaN). In some embodiments, liner 220 may be comprised of other conductive materials such as aluminum (Al), copper (Cu), nickel (Ni), cobalt (Co), ruthenium (Ru), or combinations thereof.

Metal lines 230 are formed from any type of conductive metal. For example, metal lines 230 may be composed of Ru, Cu, Co, molybdenum (Mo), tungsten (W), Al, or rhodium (Rh). Metal lines 230 may be deposited as a layer that is subsequently formed into metal lines 230 as described below. The layer that includes metal lines 230 may be deposited on liner 220 using, for example, CVD, plasma enhanced chemical vapor deposition (PECVD), physical vapor deposition (PVD), or other deposition processes. Metal lines 230 may be deposited to form a thickness of 20 to 200 nm, although other thicknesses are within the contemplated scope of the invention.

Etch stop liner 240 is optionally deposited on metal lines 230. For purposes of simplicity of explanation, the discussion herein assumes the presence of etch stop liner 240. Etch stop liner 240 may be formed from a highly etch resistant material, such as but not limited to, hafnium oxide ($HfO_2$) or aluminum oxide ($Al_2O_3$). In general, etch stop liner 240 may be formed from a dielectric or metal material. Etch stop liner 240 may be formed using a deposition process such as, for example, spin coating or ALD, to form a thickness of about 0.5 nm to about 3 nm, although other thicknesses are within the contemplated scope of the invention.

Hardmask 250 is deposited on top of etch stop liner 240. Hardmask 250 is composed of TiN, amorphous silicon (a-Si), amorphous silicon germanium (a-SiGe), or combinations thereof. In some embodiments, hardmask 250 is formed to a thickness of 10 to 60 nm, although other thicknesses are within the contemplated scope of the invention. Hardmask 810 may be deposited using, for example, any suitable deposition process, such as CVD, PECVD, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), ALD, flowable CVD, spin-on dielectrics, PVD, molecular beam epitaxy (MBE), chemical solution deposition, spin-on dielectrics, or other like process.

Subsequent to the formation of liner 220, the metal layer (e.g., metal lines 230), etch stop liner 240, and hardmask 250, hardmask 250 may be patterned as shown in FIGS. 2A and 2B by removing portions of hardmask 250 from the areas not protected by the pattern in a photoresist (not shown) using, for example, reactive ion etching (RIE).

Hardmask 250 may be patterned such that hardmask 250 protects the areas of the metal layer (e.g., metal lines 230) that corresponds to desired locations of the metal lines 230.

Subsequent to patterning hardmask 250, an etching process is performed, forming metal lines 230 as depicted in FIGS. 2A and 2B. In general, an etching process, such as RIE, laser ablation, or any other etch process may be used to selectively remove portions of etch stop liner 240, metal lines 230, and liner 220. As described above, hardmask 250 may be patterned using a photoresist (not shown) to protect areas of metal lines 230 where metal lines and vias are desired and hardmask 250 may be utilized during the etching process in the creation of the metal lines. The etching process only removes the portions of etch stop liner 240, metal lines 230, and liner 220 not protected by hardmask 250 and the etching process stops at underneath device 210. The resulting structure is positively tapered, as general depicted in FIGS. 2A and 2B.

Figure 3A:
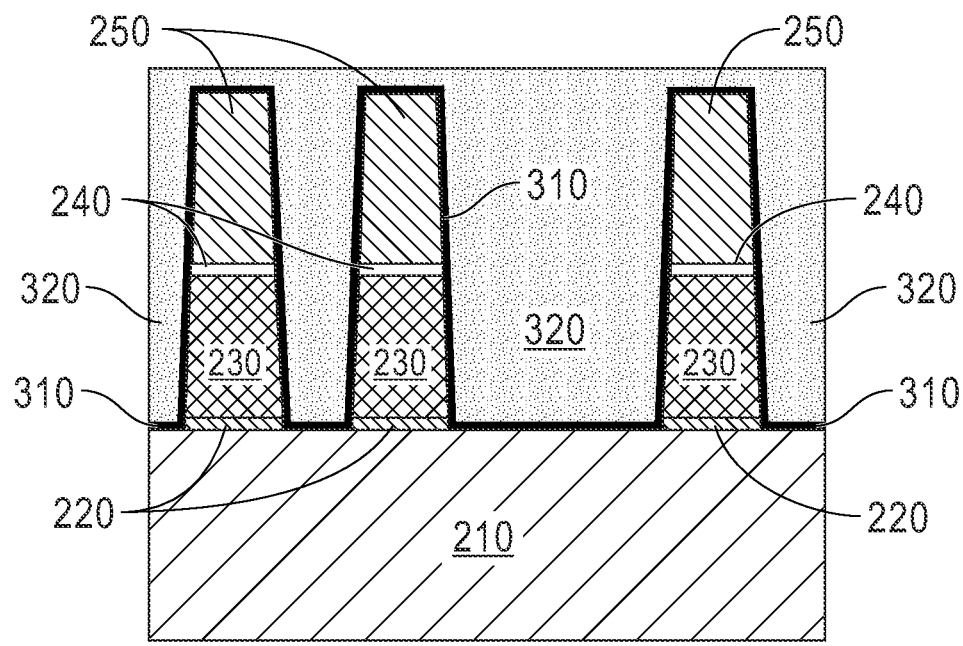
FIG. 3A depicts a cross-sectional view, along section line A of FIG. 1.
Figure 3B:
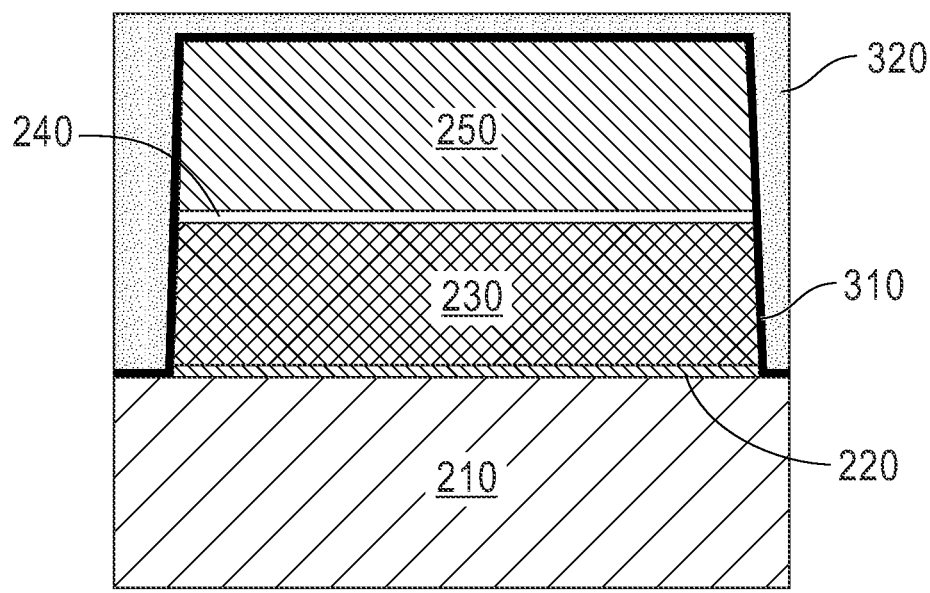
FIG. 3B depicts a cross-sectional view, along section line B of FIG. 1, of a process of forming a liner and interlayer dielectric (ILD), in accordance with an embodiment of the invention.

FIG. 3A depicts a cross-sectional view along section line A of FIG. 1 and FIG. 3B depicts a cross-sectional view along section line B of FIG. 1, of fabrication steps, in accordance with an embodiment of the present invention. FIGS. 3A and 3B depict the formation of liner 310 and interlayer dielectric (ILD) 320.

Liner 310 is deposited on exposed top and sidewall surfaces of the structure, more particularly deposited on exposed surfaces of underneath device 210, liner 220, metal lines 230, etch stop liner 240, and hardmask 250. Liner 310 is formed by forming a layer (e.g., silicon nitride (SiN)), via an in situ radical assisted deposition (iRAD) process, which creates a very conformal layer and a dense film for the liner layer. Techniques other than iRAD may be used to create liner 310, such as LPCVD.

ILD 320 may be a non-crystalline solid material such as silicon dioxide ($SiO_2$) undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD 320. The use of a self-planarizing dielectric material as ILD 320 may avoid the need to perform a subsequent planarizing step.

In some embodiments, ILD 320 can be formed on exposed surfaces of liner 310 utilizing a deposition process including, for example, CVD, PECVD, evaporation or spin-on coating. In some embodiments, particularly when non-self-planarizing dielectric materials are used as ILD 320, a planarization process or an etch back process follows the deposition of the dielectric material that provides ILD 320.

Figure 4A:
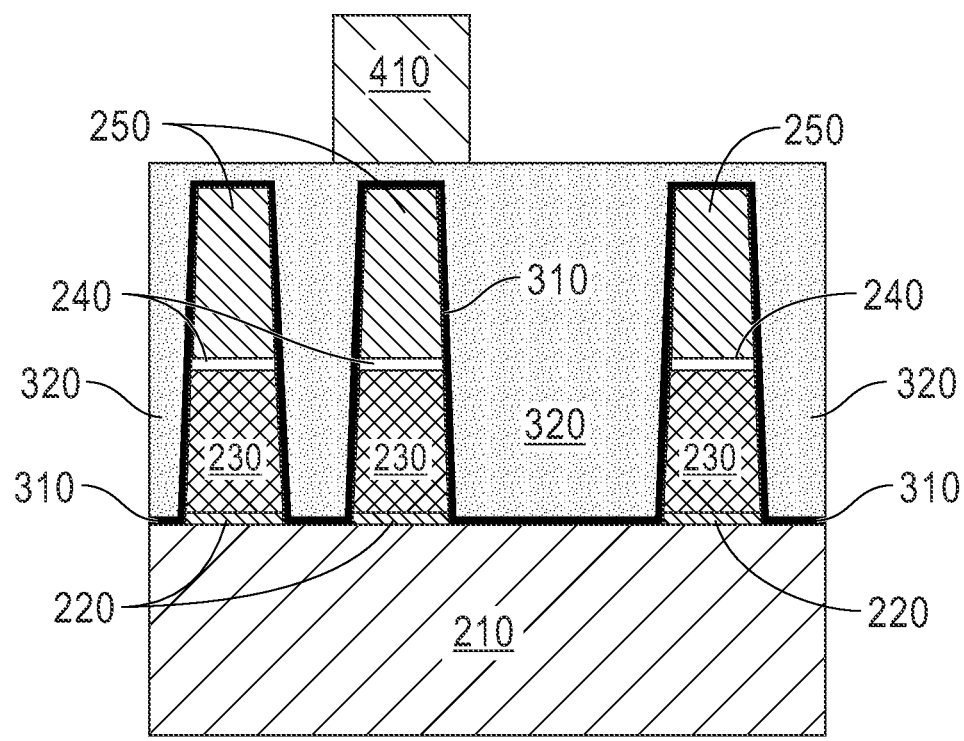
FIG. 4A depicts a cross-sectional view, along section line A of FIG. 1.
Figure 4B:
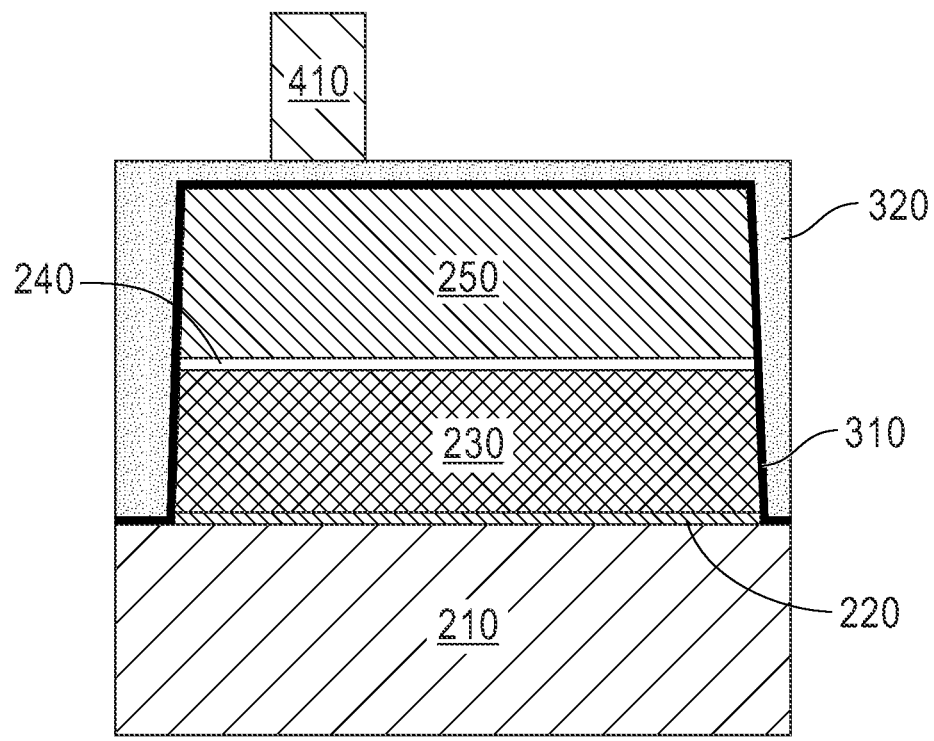
FIG. 4B depicts a cross-sectional view, along section line B of FIG. 1, of a process of forming and patterning a hardmask, in accordance with an embodiment of the invention.

FIG. 4A depicts a cross-sectional view along section line A of FIG. 1 and FIG. 4B depicts a cross-sectional view along section line B of FIG. 1, of fabrication steps, in accordance with an embodiment of the present invention. FIGS. 4A and 4B depict the formation and patterning of hardmask 410.

Hardmask 410 is deposited on top of ILD 320. Hardmask 410 may be an organic planarization layer (OPL) or any other type of hardmask layer. For example, hardmask 410 may be composed of metal or a dielectric material such as, for example, such as, for example, a low-κ dielectric, a nitride, silicon nitride, silicon oxide, SiON, SiC, SiOCN, or SiBCN. In some embodiments of the invention, hardmask 410 is a silicon nitride or silicon oxide hard mask. In some embodiments of the invention, hardmask 410 is formed to a thickness of about 40 nm to about 600 nm, for example 60 nm, although other thicknesses are within the contemplated scope of the invention. Hardmask 410 may be deposited using, for example, any suitable process, such as CVD, PECVD, UHVCVD, RTCVD, MOCVD, LPCVD, LRPCVD, ALD, flowable CVD, spin-on dielectrics, PVD, MBE, chemical solution deposition, spin-on dielectrics, or other like process.

Hardmask 410 may subsequently be patterned using a photoresist (not shown) via an etching process such that the portions of hardmask 410 remain over one or more desired sacrificial vias. A photoresist is a light-sensitive material used in processes, such as photolithography, to form a patterned coating on a surface. The photoresist may be a light-sensitive polymer. The desired hardmask pattern for hardmask 410 may be formed by removing the areas not protected by the pattern in the photoresist. Hardmask 410 is removed using, for example, RIE. RIE uses chemically reactive plasma, generated by an electromagnetic field, to remove various materials. A person of ordinary skill in the art will recognize that the type of plasma used will depend on the material of which hardmask 410 is composed, or that other etch processes such as wet chemical etching or laser ablation may be used. In general, hardmask 410 is patterned such that hardmask 410 exposes areas of ILD 320 that do not coincide with a desired location for a via.

Figure 5A:
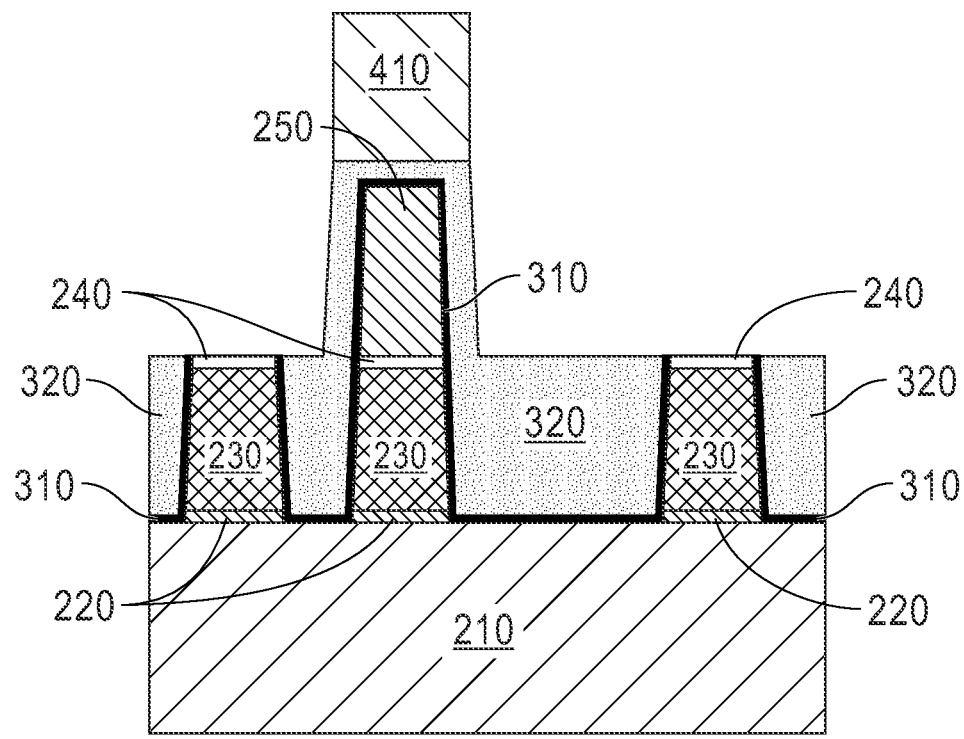
FIG. 5A depicts a cross-sectional view, along section line A of FIG. 1.
Figure 5B:
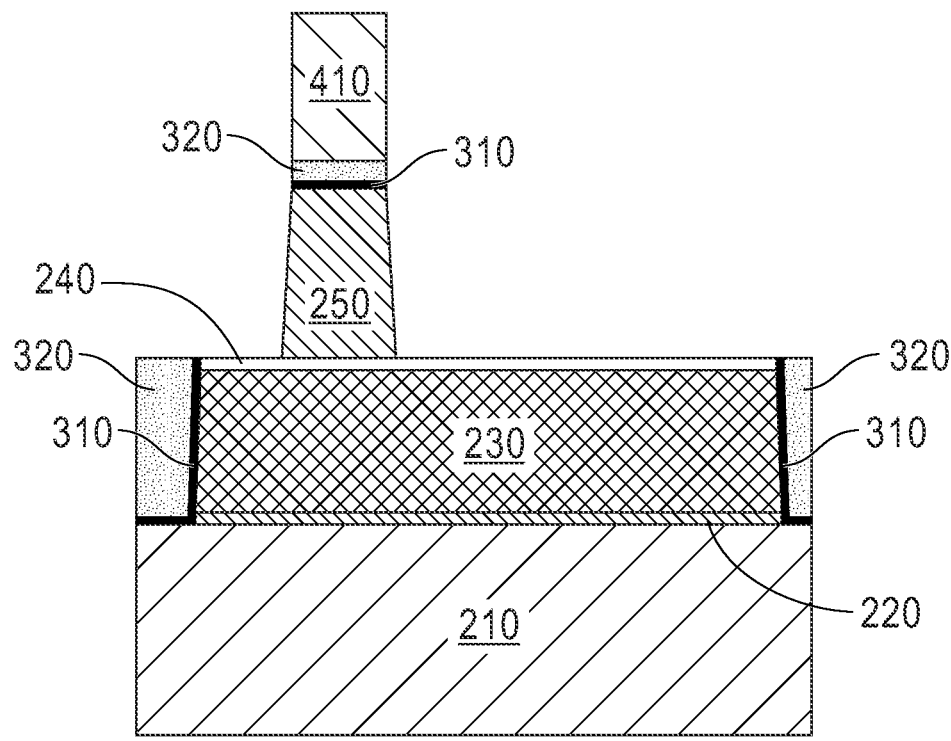
FIG. 5B depicts a cross-sectional view, along section line B of FIG. 1, of a process of etching utilized in the formation of a desired sacrificial via, in accordance with an embodiment of the invention.

FIG. 5A depicts a cross-sectional view along section line A of FIG. 1 and FIG. 5B depicts a cross-sectional view along section line B of FIG. 1, of fabrication steps, in accordance with an embodiment of the present invention. FIGS. 5A and 5B depict an etch process utilized in the formation of a desired sacrificial via.

An etching process, such as RIE, laser ablation, or any etch process which can be used to selectively remove a portion of material such as ILD 320, hardmask 250, and liner 310 may be utilized. As described above, with reference to FIGS. 4A and 4B, hardmask 410 may be patterned using a photoresist (not shown) to expose areas of ILD 320 that do not correspond to desired sacrificial via locations and hardmask 410 may be utilized during the etching process. The etching process only removes the portions of ILD 320, hardmask 250, and liner 310 not protected by hardmask 410 and the etching process stops at etch stop liner 240. While in some embodiments, ILD 320, hardmask 250, and liner 310 are etched at equal rates, as is depicted in FIGS. 5A and 5B, it is acceptable if ILD 320 is etched at a slower or faster rate than hardmask 250 and liner 310 (see FIGS. 6A and 6B).

Figure 6A:
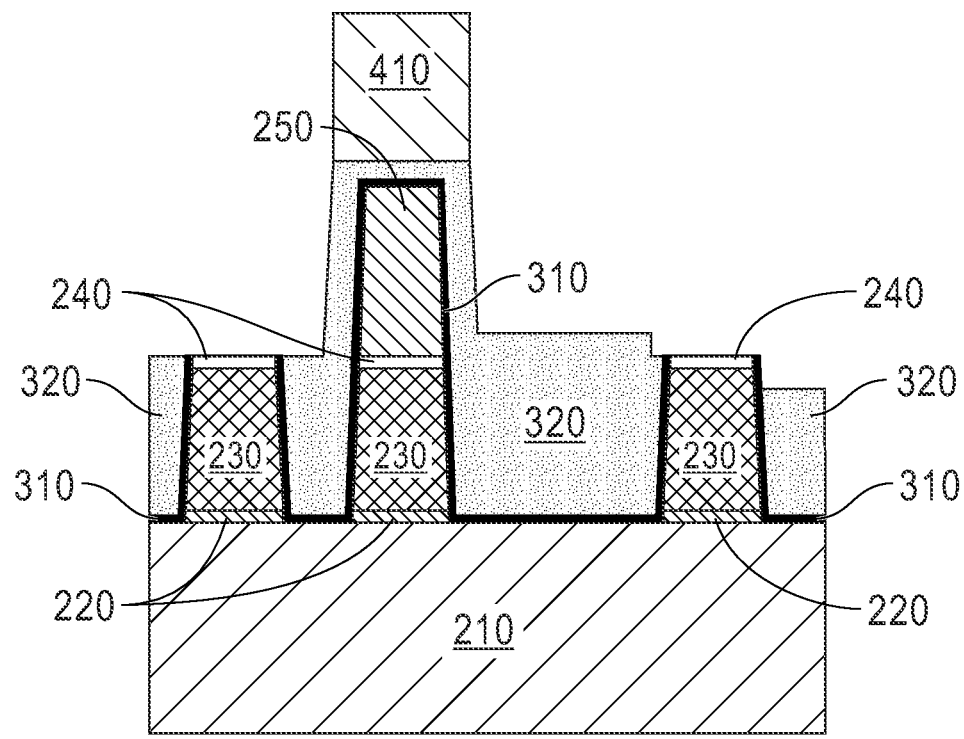
FIG. 6A depicts a cross-sectional view, along section line A of FIG. 1.
Figure 6B:
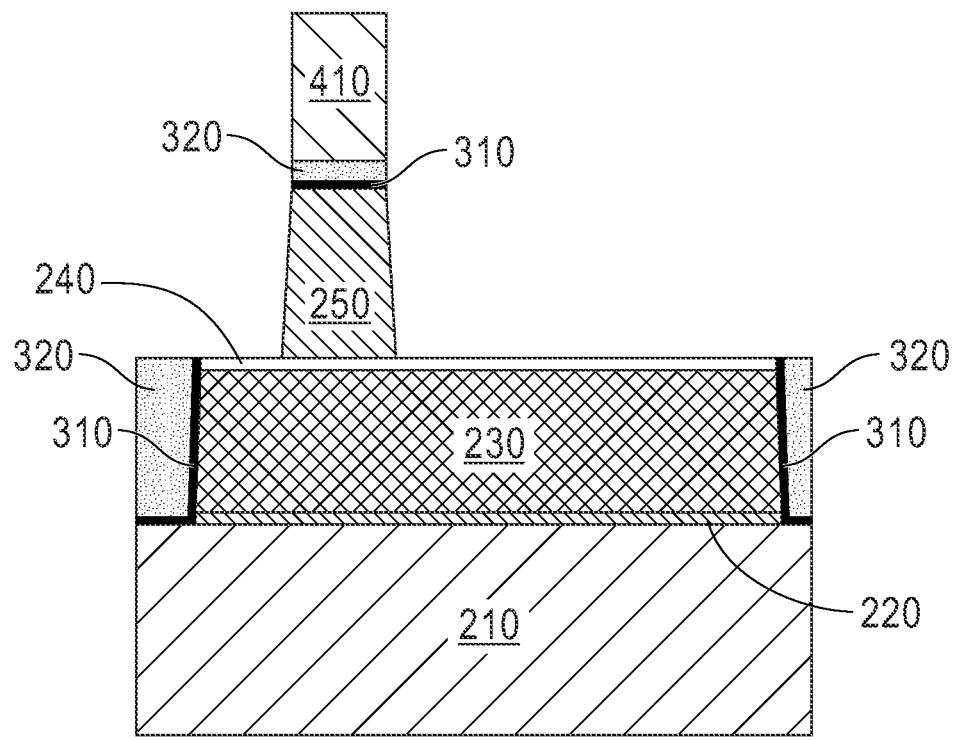
FIG. 6B depicts a cross-sectional view, along section line B of FIG. 1, of a process of etching utilized in the formation of a desired sacrificial via, in accordance with an embodiment of the invention.

FIG. 6A depicts a cross-sectional view along section line A of FIG. 1 and FIG. 6B depicts a cross-sectional view along section line B of FIG. 1, of an alternate embodiment from that depicted of FIGS. 5A and 5B to illustrate that ILD 320 may be etched at either a slower rate than hardmask 250 or, alternatively, at a faster rate than hardmask 250. While FIG. 6A depicts both a slower and faster etch rate for ILD 320, one of ordinary skill in the art would understand that this is for illustration purposes only and actual embodiments would have either a slower or a faster etch rate, if the etch rates were not equal (as depicted in FIG. 5).

Figure 7A:
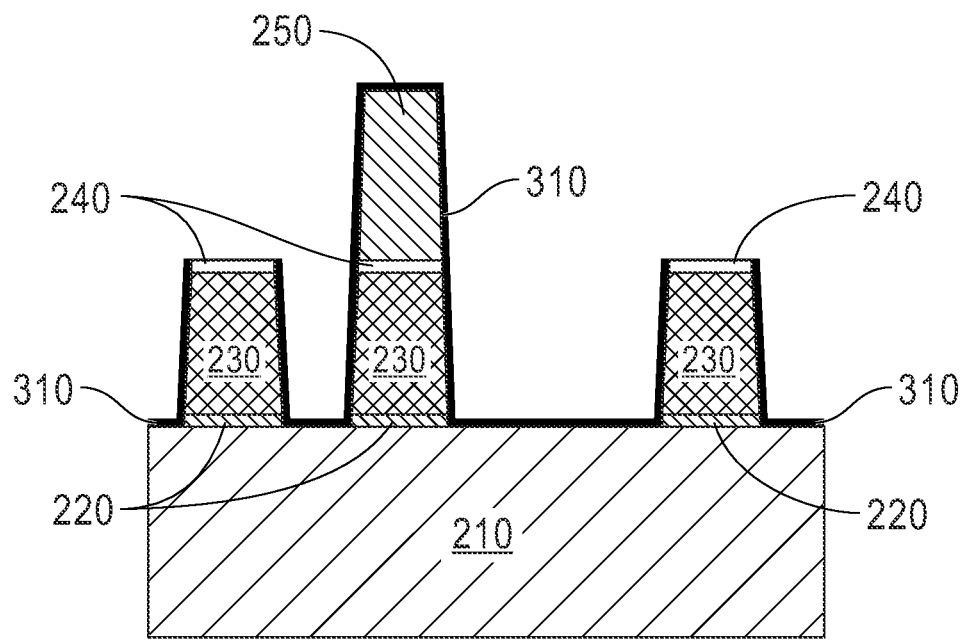
FIG. 7A depicts a cross-sectional view, along section line A of FIG. 1.
Figure 7B:
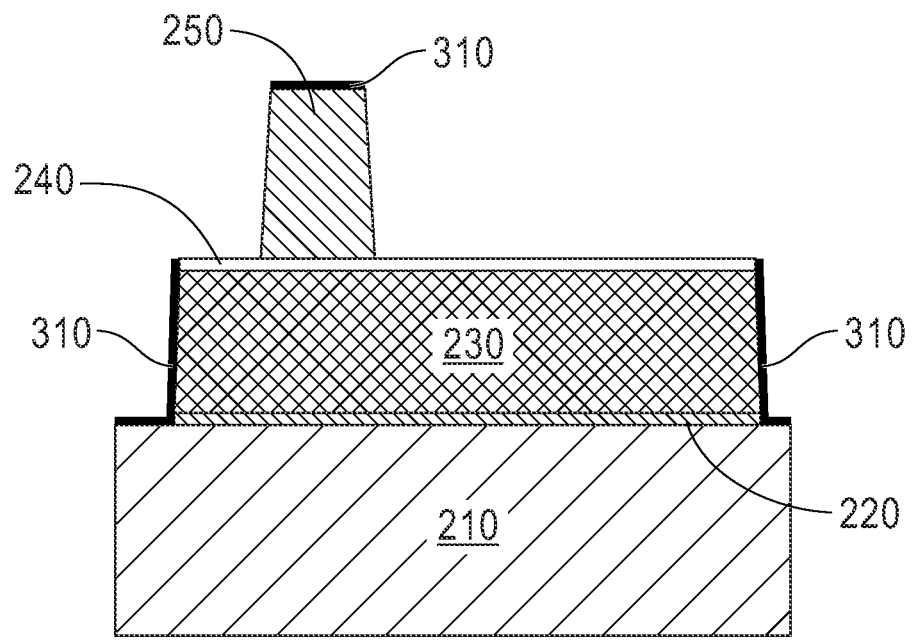
FIG. 7B depicts a cross-sectional view, along section line B of FIG. 1, of a process of removing the hardmask and ILD, in accordance with an embodiment of the invention.

FIG. 7A depicts a cross-sectional view along section line A of FIG. 1 and FIG. 7B depicts a cross-sectional view along section line B of FIG. 1, of fabrication steps, in accordance with an embodiment of the present invention. FIGS. 7A and 7B depict the removal of hardmask 410 and ILD 320.

In general the process of removing hardmask 410 involves the use of an etching process such as RIE, laser ablation, or any etch process which can be used to selectively remove a portion of material, such as hardmask 410.

Similarly, ILD 320 may be removed via an etching process, such as the etching process described with respect to removing hardmask 410. In general, during such an etch process, etch stop liner 240 and liner 310 act to protect metal lines 230 during the removal of ILD 320.

Figure 8A:
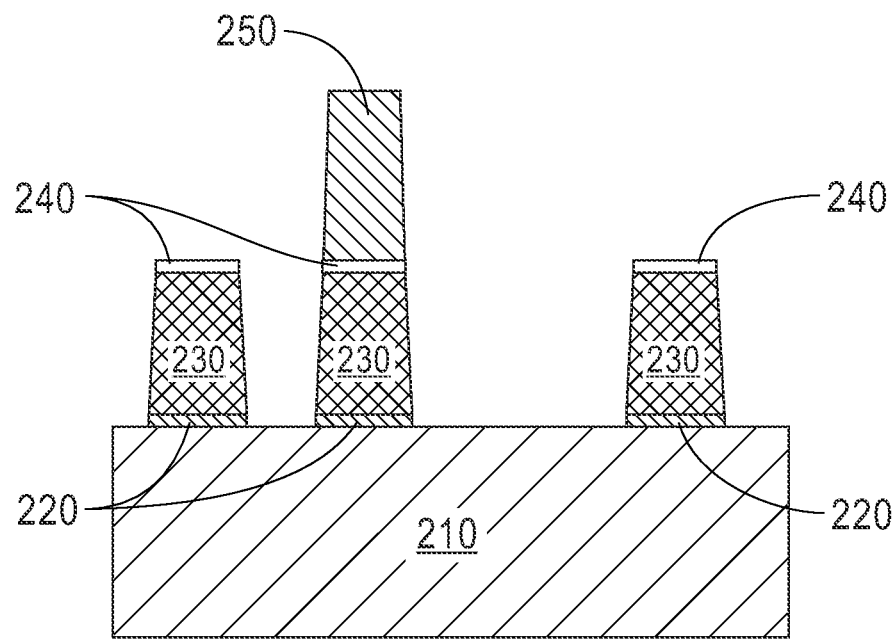
FIG. 8A depicts a cross-sectional view, along section line A of FIG. 1.
Figure 8B:
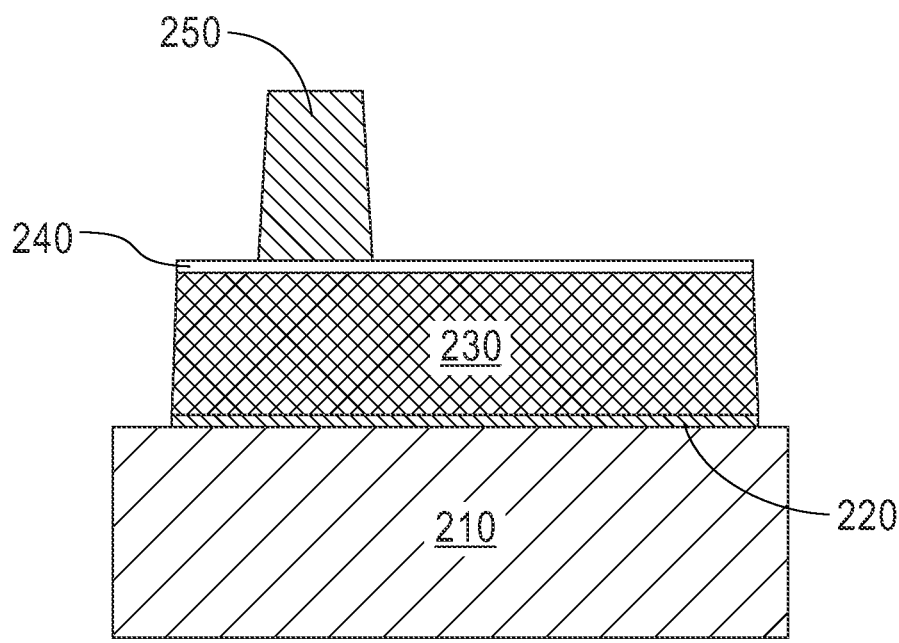
FIG. 8B depicts a cross-sectional view, along section line B of FIG. 1, of a process of removing the liner, in accordance with an embodiment of the invention.

FIG. 8A depicts a cross-sectional view along section line A of FIG. 1 and FIG. 8B depicts a cross-sectional view along section line B of FIG. 1, of fabrication steps, in accordance with an embodiment of the present invention. FIGS. 8A and 8B depict the removal of liner 310.

In general, the process of removing liner 310 involves the use of an etching process such as RIE, laser ablation, or any etch process which can be used to selectively remove a portion of material, such as liner 310.

Figure 9A:
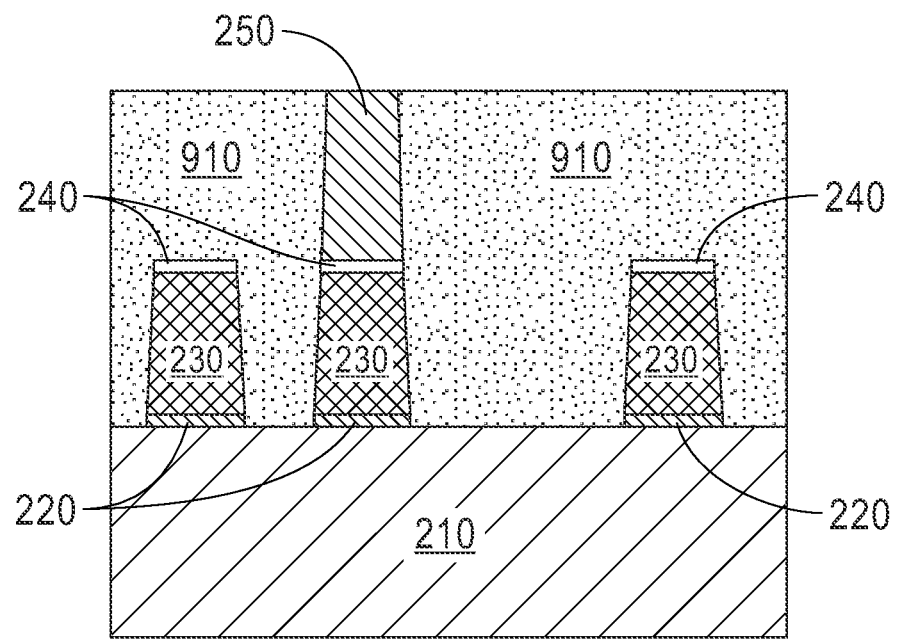
FIG. 9A depicts a cross-sectional view, along section line A of FIG. 1.
Figure 9B:
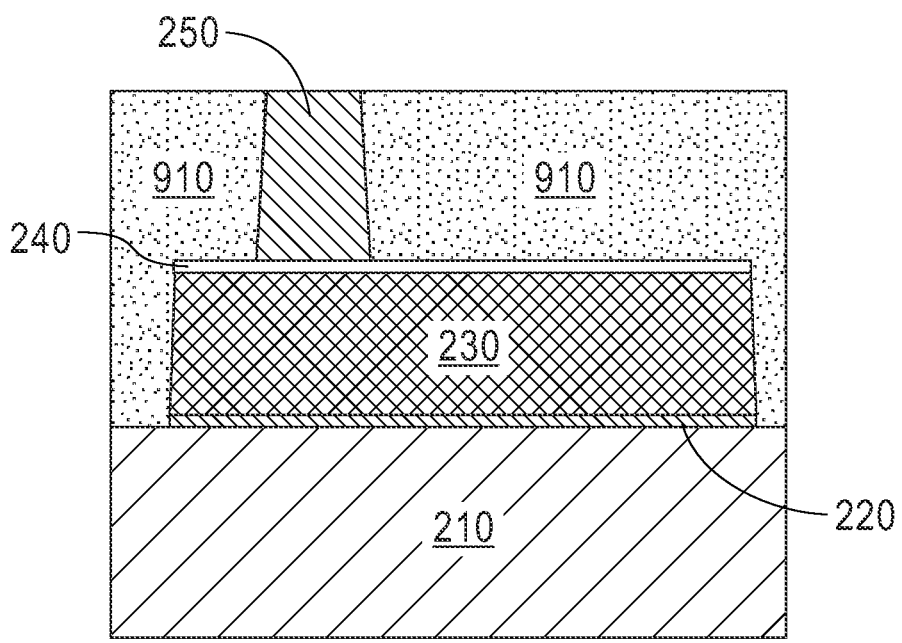
FIG. 9B depicts a cross-sectional view, along section line B of FIG. 1, of a process of forming a low-κ layer, in accordance with an embodiment of the invention.

FIG. 9A depicts a cross-sectional view along section line A of FIG. 1 and FIG. 9B depicts a cross-sectional view along section line B of FIG. 1, of fabrication steps, in accordance with an embodiment of the present invention. FIGS. 9A and 9B depict the formation of low-κ layer 910.

Low-κ layer 910 is generally a layer of low-κ dielectric material. Low-κ is a material with a small relative dielectric constant (κ) relative to $SiO_2$. Low-κ materials include, for example, SiCOH, fluorine-doped $SiO_2$, organosilicate glass (OSG), porous $SiO_2$, porous organosilicate glass, spin-on organic polymeric dielectrics, and spin-on silicon based polymeric dielectrics. In some embodiments, low-κ layer 910 is spin-on-glass. Spin-on-glass is an interlayer dielectric material applied in liquid form to fill narrow gaps in the sub-dielectric surface. In some embodiments, low-κ layer 910 is deposited using flowable chemical vapor deposition (fCVD) or spin-on dielectric methods. Low-κ layer 910 may be deposited above the desired height.

In embodiments where low-K layer 910 is deposited above the desired height, a subsequent planarization process, such as CMP, may be utilized to reduce the height of low-κ layer 910 such that top surface(s) of hardmask 250 are exposed.

Figure 10A:
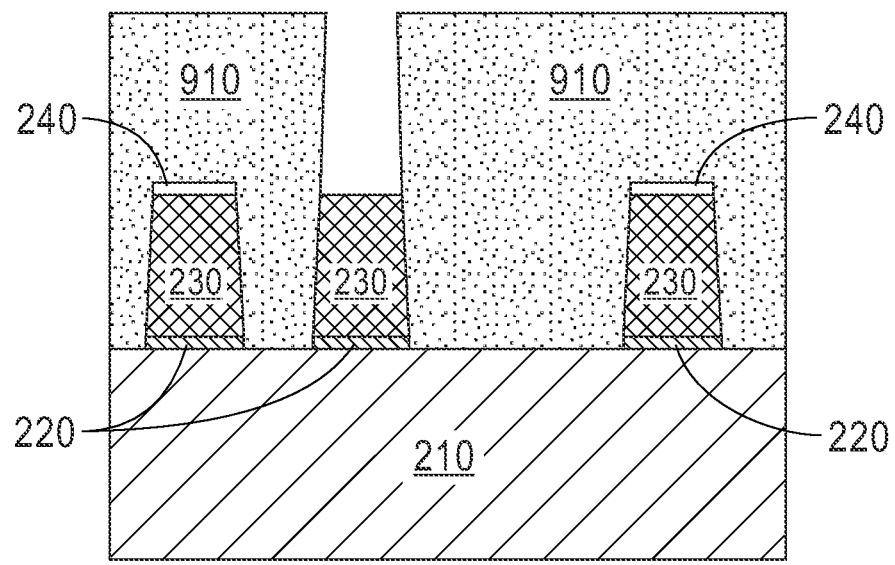
FIG. 10A depicts a cross-sectional view, along section line A of FIG. 1.
Figure 10B:
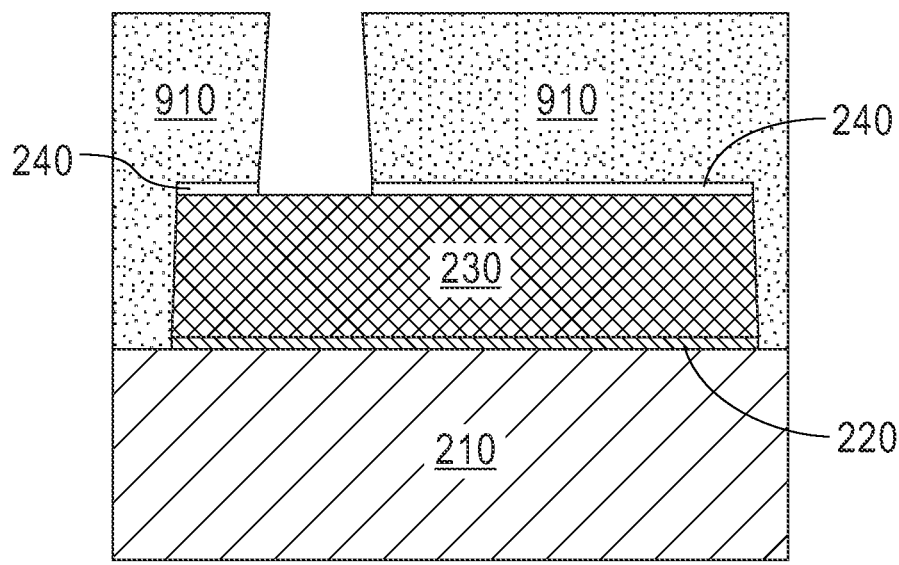
FIG. 10B depicts a cross-sectional view, along section line B of FIG. 1, of a process of removing the hardmask, in accordance with an embodiment of the invention.

FIG. 10A depicts a cross-sectional view along section line A of FIG. 1 and FIG. 10B depicts a cross-sectional view along section line B of FIG. 1, of fabrication steps, in accordance with an embodiment of the present invention. FIGS. 10A and 10B depict the removal of hardmask 250.

In general, the process of removing hardmask 250 involves the use of an etching process such as RIE, laser ablation, or any etch process which can be used to selectively remove a portion of material, such as hardmask 250 with respect to low-K layer 910.

Figure 11A:
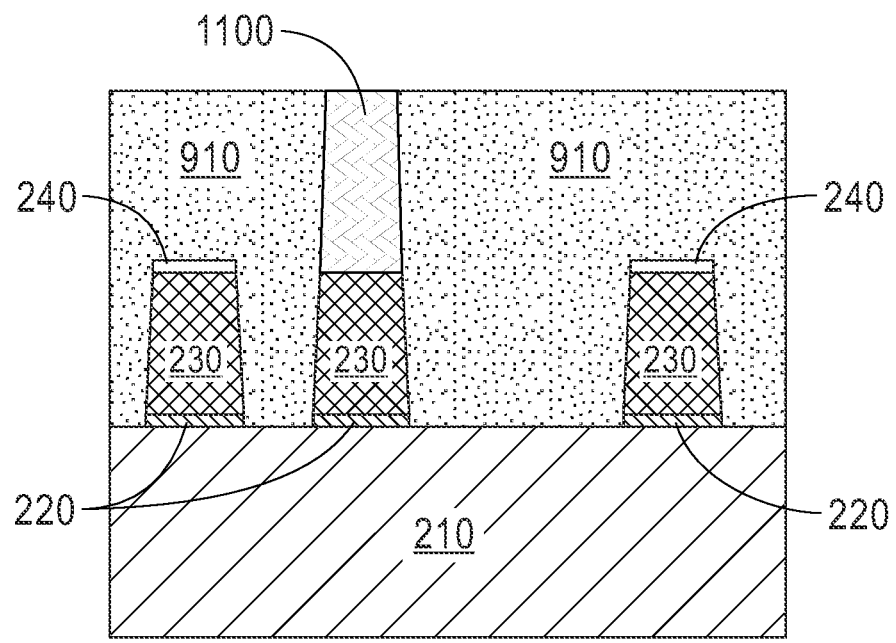
FIG. 11A depicts a cross-sectional view, along section line A of FIG. 1.
Figure 11B:
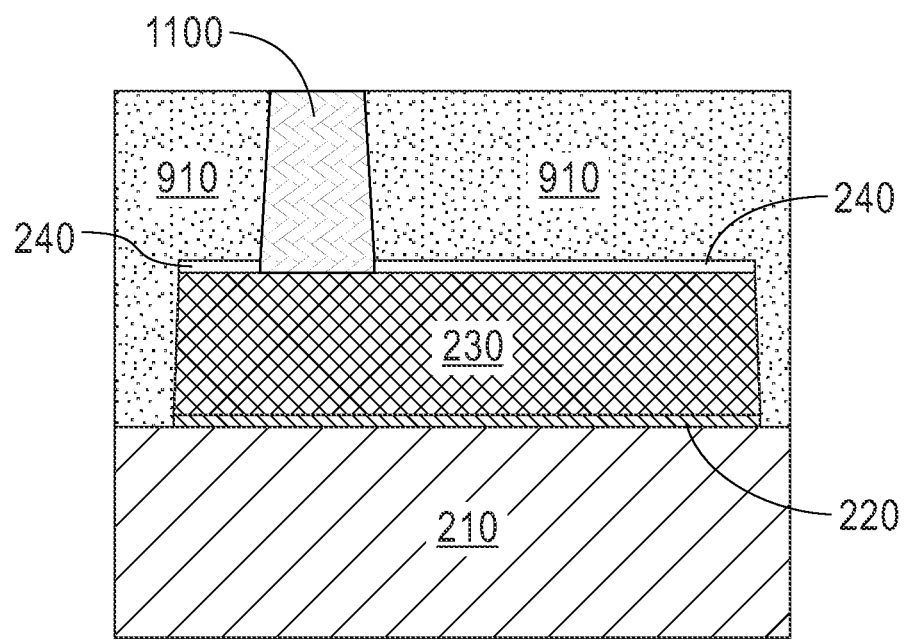
FIG. 11B depicts a cross-sectional view, along section line B of FIG. 1, of a process of forming the via, in accordance with an embodiment of the invention.

FIG. 11A depicts a cross-sectional view along section line A of FIG. 1 and FIG. 11B depicts a cross-sectional view along section line B of FIG. 1, of fabrication steps, in accordance with an embodiment of the present invention. FIGS. 11A and 11B depict the formation of via 1100.

Via 1100 are formed from any type of conductive metal. For example, via 1100 may be composed of Ru, Cu, Co, Mo, W, Al, or Rh. In some embodiments, via 1100 is formed of the same type of metal as metal lines 230. Via 1100 may be formed using damascene or selective metal growth techniques.

Damascene processing is an additive process where a dielectric is deposited, the dielectric is etched according to a defined pattern, metal is filled according to the pattern, and excess metal is removed by CMP.

Selective metal growth techniques include bottom-up formation through selective metal growth. In some embodiments, via 1100 is grown via selective metal growth such that deposition and etching is not required. A work function metal acting as a seeding layer (not shown) may be utilized such that the via 1100 metal cannot grow without, such that the via 1100 metal grows only on the surfaces of the work function metal. The work function metal may be, for example, TaN, TiN, titanium aluminum carbine (TiAlC), or TiC, for example.

The resulting structure is a BEOL metal line and top via interconnect structure that includes metal lines and top vias with a positive tapered angle, no sidewall metal liner present on the metal lines and vias, and liners that are present both above and below the metal lines, except for where the vias meet the metal lines.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
    forming a metal line on a bottom liner, a sacrificial hardmask on a top surface of the metal line, wherein:
        the bottom liner is of a different material than the metal line;
        a bottom surface of the metal line is directly on a top surface of the bottom liner;
        the metal line is tapered such that a width of the bottom surface of the metal line is greater than a width of a top surface of the metal line; and
        the bottom liner contacts the metal line only on the bottom surface of the metal line;
    selectively removing portions of the sacrificial hardmask that do not correspond a desired location of a top via; and
    replacing the remaining sacrificial hardmask with the top via, wherein:
        a bottom surface of the top via is directly on the top surface of the metal line; and
        the top via is tapered such that a width of the bottom surface of the top via is greater than a width of a top surface of the top via.

2. The method of claim 1, further comprising:
    prior to forming the sacrificial hardmask, forming a liner on the metal line.

3. The method of claim 1, wherein the bottom liner is selected from the group consisting of: TaN, TiN, TiAlC, and TiC.

4. The method of claim 1, wherein selectively removing the portions of the sacrificial hardmask that do not correspond to the desired location of the top via comprises:
    forming a liner on exposed portions of a device underneath the bottom liner, the bottom liner, the metal line, and the sacrificial hardmask;
    forming an interlayer dielectric (ILD) layer on the liner;
    patterning a hardmask to protect the desired location of the top via; and
    removing portions of the ILD layer, the liner, and the sacrificial hardmask unprotected by the hardmask.

5. The method of claim 4, further comprising:
    removing the hardmask;
    removing the ILD layer; and
    removing the liner.

6. The method of claim 1, wherein replacing the remaining sacrificial hardmask with the top via comprises:
    forming a low-κ dielectric layer on exposed portions of a device underneath the bottom liner, the bottom liner, the metal line, and the sacrificial hardmask;
    removing the sacrificial hardmask to form a gap; and
    forming the top via within the gap.

7. The method of claim 6 wherein forming the top via within the gap comprises forming the top via within the gap utilizing damascene processing.

8. The method of claim 6, wherein forming the top via within the gap comprises forming the top via within the gap utilizing selecting metal growth techniques.

9. The method of claim 1, wherein the metal line and the top via comprise Ru.

10. The method of claim 1, wherein the metal line and the top via comprise a same material.

11. The method of claim 6, wherein the low-κ dielectric layer is in direct contact with sidewalls of the top via and the metal line.

12. The method of claim 1, wherein the top via is directly on the top surface of the metal line.

13. The method of claim 2, wherein replacing the remaining sacrificial hardmask with the top via comprises:
    forming a low-κ dielectric layer on exposed portions of a device underneath the bottom liner, the bottom liner, the metal line, and the sacrificial hardmask;

removing the sacrificial hardmask to form a gap;
removing an exposed portion of the liner within the gap; and
forming the top via within the gap.

14. The method of claim 4, wherein the ILD layer comprises a material selected from the group consisting of: spin-on glass (SOG), $SiO_2$, undoped silicate glass (USG), fluorosilicate glass (FSG), borophosphosilicate glass (BPSG), a spin-on low-k dielectric layer, a chemical vapor deposition CVD los-k dielectric layer, and SiLK.

15. A semiconductor structure comprising:
a bottom liner;
a metal line with a bottom surface directly on a top surface of the bottom liner, wherein:
  the bottom liner is of a different material than the metal line;
  the metal line is tapered such that a width of the bottom surface of the metal line is greater than a width of a top surface of the metal line; and
  the bottom liner contacts the metal line only on the bottom surface of the metal line; and
a top via with a bottom surface directly on a top surface of the metal line, wherein the top via is tapered such that a width of the bottom surface of the top via is greater than a width of a top surface of the top via.

16. The semiconductor structure of claim 15, further comprising a low-κ dielectric layer in direct contact with sidewalls of the top via, and the bottom liner.

17. The semiconductor structure of claim 15, wherein the metal line and the top via comprise a material selected from the group consisting of: Ru, Co, Mo, W, Al, and Rh.

18. The semiconductor structure of claim 15, wherein the metal line and the top via comprise a same material.

19. The semiconductor structure of claim 15, wherein the bottom liner is of a material selected from the group consisting of: TaN, TiN, Al, Cu, Ni, Co, and Ru.

20. The semiconductor of claim 15, further comprising a liner on portions of the top surface of the metal line not in direct contact with the top via.

* * * * *